United States Patent
Fay et al.

(10) Patent No.: US 6,471,464 B1
(45) Date of Patent: Oct. 29, 2002

(54) WAFER POSITIONING DEVICE

(75) Inventors: Richard Fay, San Jose, CA (US); Paul Peng, Hsin-Chu (TW); Wei Chen, Hsin-Chu (TW); Gino Tsai, Hsin-Chu (TW); J Fan Chang, Hsin-Chu (TW)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/415,556

(22) Filed: Oct. 8, 1999

(51) Int. Cl.$^7$ ............................................ B65G 49/07
(52) U.S. Cl. ...................................... 414/783; 414/936
(58) Field of Search ................................. 414/783, 936, 414/941

(56) References Cited

U.S. PATENT DOCUMENTS

| | | | |
|---|---|---|---|
| 4,880,348 A | | 11/1989 | Baker et al. ................. 414/783 |
| 5,028,955 A | * | 7/1991 | Hayashida et al. ........... 355/53 |
| 5,361,121 A | * | 11/1994 | Hattori et al. ................ 355/50 |
| 5,822,213 A | | 10/1998 | Huynh ................... 364/478.01 |
| 5,825,913 A | * | 10/1998 | Rostami et al. ............. 382/151 |
| 5,880,816 A | * | 3/1999 | Mimura et al. .............. 355/53 |
| 5,905,850 A | * | 5/1999 | Kaveh ......................... 395/94 |
| 5,990,650 A | * | 11/1999 | Brock ......................... 318/640 |
| 6,089,763 A | * | 7/2000 | Choi et al. .................. 396/611 |

FOREIGN PATENT DOCUMENTS

| | | |
|---|---|---|
| JP | 6236918 A | 8/1994 |
| JP | 08008328 A | 1/1996 |
| JP | 09116689 A | 5/1997 |
| JP | 10270533 A | 10/1998 |
| WO | WO 95/00819 | 1/1995 |

* cited by examiner

Primary Examiner—Janice L. Krizek
(74) Attorney, Agent, or Firm—Dugan & Dugan

(57) ABSTRACT

A device for orienting and/or centering a wafer is provided. The device employs a CCD camera and backlighting source which enhances the CCD camera's ability to detect wafer position. The backlighting source may be positioned along the side of the wafer opposite the CCD camera, or may be positioned adjacent the CCD camera. When positioned adjacent the CCD camera one or more shields are employed to prevent direct or reflected light from impacting the top surface of the wafer being detected by the CCD camera. Accordingly the only light detected by the CCD camera is light which passes the wafer and reflects from a surface therebeyond, back to the CCD camera, resulting in effective backlighting of the wafer. The image of the wafer may be further sharpened by roughening the surface from which light reflects back to CCD camera.

16 Claims, 5 Drawing Sheets

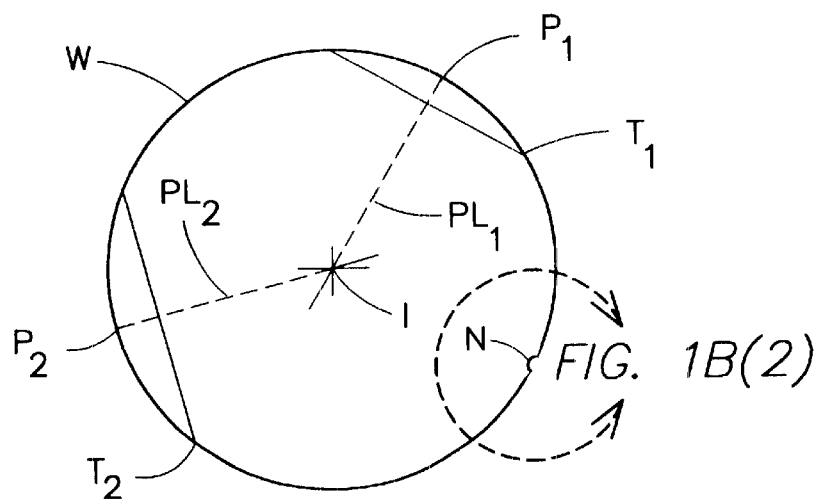
FIG. 1B(1)
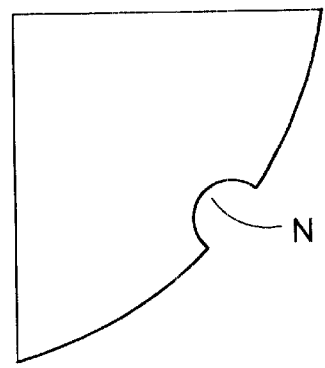
FIG. 1B(2)

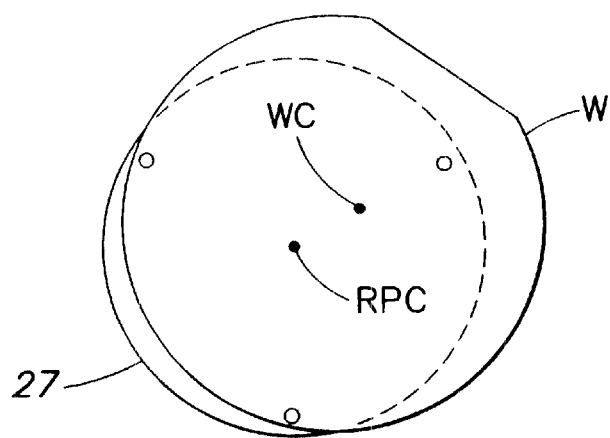
FIG. 1C(1)
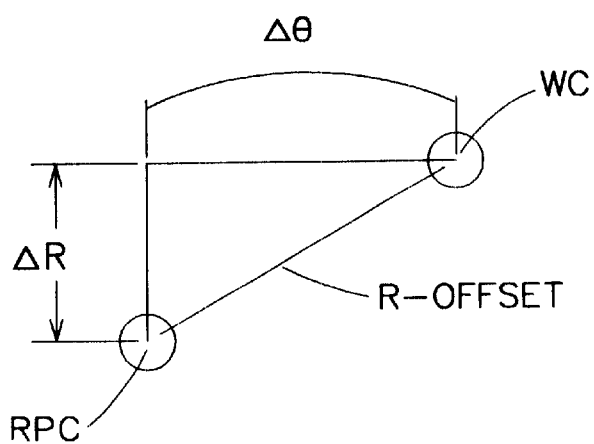
FIG. 1C(2)

WAFER POSITIONING DEVICE

BACKGROUND OF THE INVENTION

Proper centering of a semiconductor wafer is essential during wafer processing and transport in order to avoid costly errors such as non-uniform processing and/or wafer breakage. During semiconductor device processing a wafer must be accurately centered on a wafer support platform or chuck in order to ensure the wafer will receive uniform processing across its entire face (e.g., uniformly deposited layers) or to ensure that the chuck will not be damaged. Similarly, due to the rapid decrease in mechanical tolerancing associated with continually decreasing system footprint (i.e., the decrease of a fabrication system's lateral dimensions), a wafer must be accurately centered on the transfer mechanism to avoid breakage (caused by a wafer falling or striking a chamber component) during semiconductor device transport, and to reduce the probability of the wafer sliding off or being dropped by the transfer mechanism. In addition, for processes sensitive to crystal orientation or pattern alignment, wafers will have a notch or flat to signify the substrate's crystal orientation or pattern alignment, this notch or flat must be aligned so as to be in the appropriate location with respect to the chamber components. Accordingly numerous wafer orienting and/or centering devices (i.e., positioning devices) exist.

A conventional wafer positioning device is disclosed in Japanese patent application number 05045948 published Aug. 23, 1994 (Japanese application number 948). The device disclosed in Japanese application number 948 employs a charge coupled device (CCD) camera installed above a rotary table which detects the image of a semiconductor wafer located on the rotary table and applies image processing to detect the position of the wafer's center of gravity. Specifically the CCD camera takes in a circumferential of the semiconductor wafer located on the rotary table. The device then applies image processing to this frame so as to determine the orientation of the wafer.

In practice, however, CCD cameras have difficulty distinguishing the wafer from other surfaces such as the bottom surface of the chamber in which positioning occurs. Accordingly an improved wafer positioning device, which more reliably detects wafer position, is needed.

SUMMARY THE INVENTION

The present invention provides a wafer positioning device which reliably detects wafer position by employing a backlighting source. Specifically, the invention employs a CCD camera adapted to detect a first region which is larger than a wafer to be detected by the CCD camera, and thus encompasses the edge of the wafer to be detected, a backlighting source adapted to direct light to a second region which extends outwardly from at least the edge of the wafer to be detected by the CCD camera, and a controller operatively coupled to the CCD camera for determining the wafer's position based on the backlighting detected by the CCD camera.

Preferably both the CCD camera and the backlighting source are mounted outside a vacuum chamber, adjacent one or more quartz windows which allow the CCD camera and backlighting source to respectively detect and emit light from and into the processing chamber. Most preferably the CCD camera and the backlighting source are located on the same side of the vacuum chamber, thus allowing them to share a common quartz window, such as that conventionally located on the top of a vacuum chamber. In such an arrangement a shield is operatively coupled to the backlighting source so that light emitted from the backlighting source is blocked from reaching the top surface of the wafer. This prevents light from reflecting off the top surface of the wafer and being detected by the CCD camera, and thus ensures that all light detected by the CCD camera is "backlighting" coming from behind the wafer.

As described generally above, the shield ensures that light travels past the wafer surface and strikes the bottom surface of the vacuum chamber. The bottom surface of the vacuum chamber reflects at least a portion of the light back to the CCD camera. Any portion of the light which reflects from the bottom surface of the processing chamber toward the wafer will be blocked by the bottom surface of the wafer, and thereby prevented from reaching the CCD camera. Based on the reflected light detected by the CCD camera the controller is able to determine wafer position.

In a most preferred embodiment the shield comprises a first shield positioned to block direct light emitted by the backlighting source from reaching the top surface of the wafer, and a second shield positioned to block reflected light (e.g. light emitted from the backlighting source and reflected by chamber surfaces) from reaching the top surface of the wafer. The wafer is therefor effectively backlit, making the perimeter of the wafer easily detectable.

Wafer position detection may be further improved by roughening the bottom surface of the vacuum chamber so that light reflected therefrom will scatter. Scattering the light insures that some light will impact the bottom surface of the wafer and be blocked thereby. Scattered light therefore sharpens the outline of the wafer detected by the CCD camera.

Preferably the controller calculates both centering and alignment information; a rotatable platform which supports the wafer, rotates to position the wafer notch or flat in a desired orientation; and a wafer handler which transfers the wafer adjusts its operation (e.g., during wafer pick up or drop off) such that the wafer is accurately centered when subsequently placed within a processing chamber.

Other objects, features and advantages of the present invention will become more fully apparent from the following detailed description of the preferred embodiments, the appended claims and the accompanying drawings.

BRIEF DESCRIPTION OF THE DRAWINGS

FIGS. 1B(1), 1B(2), 1C(1) and 1C(2) are schematic diagrams of an exemplary wafer during wafer center finding and alignment within the wafer positioning device of FIG. 1A;

DETAILED DESCRIPTION OF THE PREFERRED EMBODIMENTS

Figure 1A:
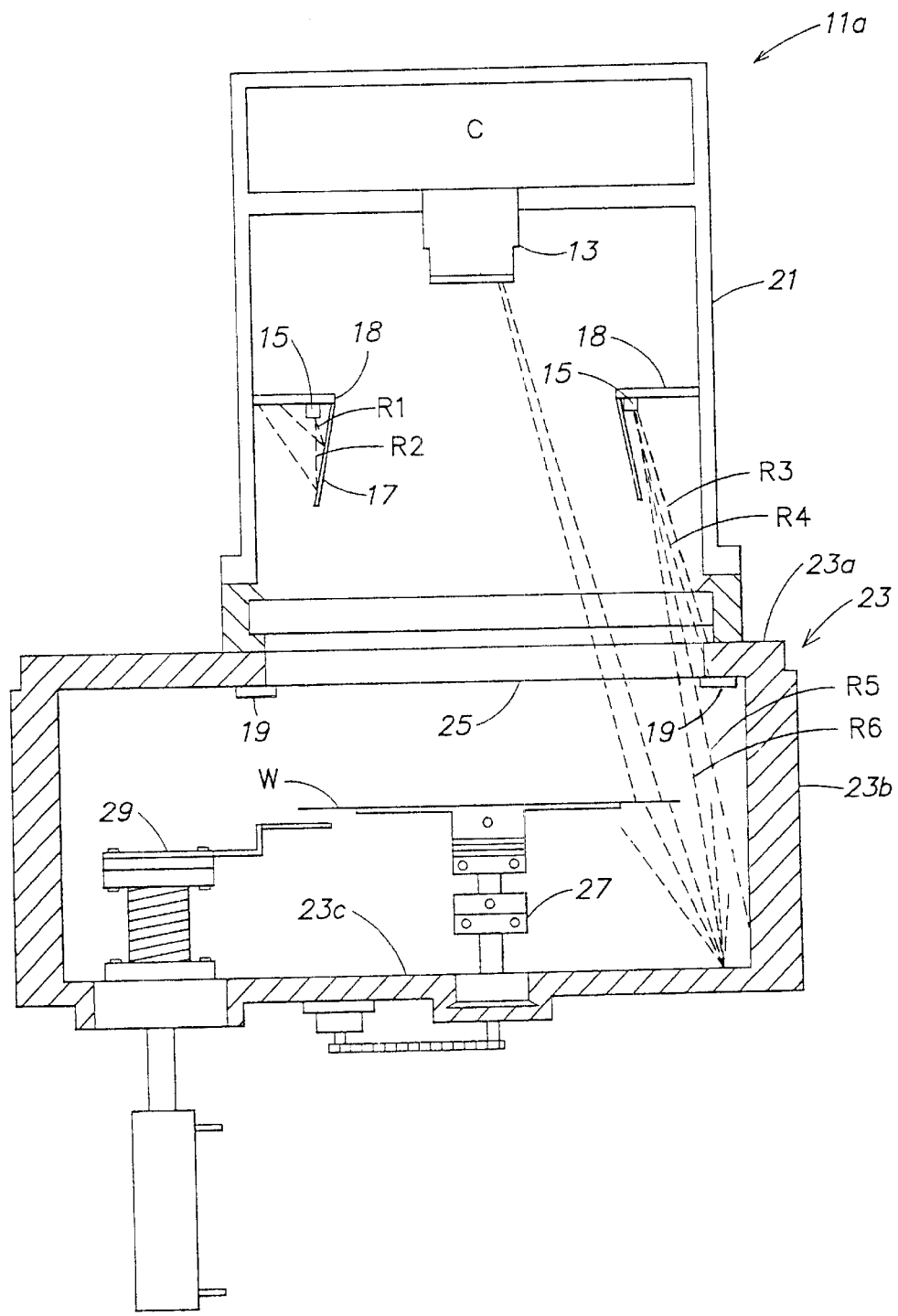
FIG. 1A is a schematic side elevational view of a first aspect of the inventive wafer positioning device.

FIG. 1A is a schematic side elevational view of a first aspect of an inventive wafer positioning device 11a. The wafer positioning device 11a comprises a CCD camera 13, a backlighting source, such as a ring of light emitting diodes (LEDs) 15, and a first and second shield 17, 19 respectively.

Light emitted from the LEDs 15 is shielded by the first shield 17 and the second shield 19 so that neither direct nor reflected light originated by the LEDs 15 impacts the top surface of a wafer W positioned therebeneath, as further described below.

The wafer positioning device 11a may be mounted within a housing 21 which is coupled to a top surface 23a of a chamber 23 such that light emitted from the LEDs 15 and detected by the CCD camera 13 enters and exits the chamber 23 via a quartz window 25 located along the top surface 23a thereof. Within the chamber 23 a wafer W is positioned on a platform 27 which preferably is rotatable, and a wafer handler 29 is operatively coupled to the rotatable platform 27 so that the wafer handler 29 may transfer the wafer W to and from the rotatable platform 27.

The CCD camera 13 is adapted to detect a first region which is larger than the circumference of the wafer W. The first shield 17 is positioned to block direct light emitted by the LEDs 15 from reaching the top surface of the wafer W. The presently preferred position for the first shield 17 is to mount the first shield 17 along the inside of the LEDs 15 and to angle the first shield 17 outwardly (e.g. away from the wafer W) by an angle which is sufficient to block light (which is not blocked by the second shield 19) from reaching the top surface of the wafer W, as described further below.

The second shield 19 is positioned to block light which is emitted by the LEDs 15 and, absent the second shield 19, would be reflected (e.g. by a chamber surface) to the top surface of the wafer W. The presently preferred position for the second shield 19 is to mount the second shield 19 on the chamber side of the quartz window 25, such that the second shield 19 extends inwardly a short distance along the outer edge of the quartz window 25. It will be understood by those of ordinary skill in the art that the specific dimensions and the positions of the first shield 17 and the second shield 19 may vary (e.g., depending on the distance therebetween, depending on the size of the wafer and the distance to the wafer, etc.).

In operation the wafer W is placed on the rotatable platform 27 and the ring of LEDs 15 emits light as represented by rays R1-4. Rays R1, R2 which directly or indirectly impact the first shield 17 are blocked by the first shield 17 from reaching the top surface of the wafer W, and are blocked from reaching the CCD camera 13 by the mounting bracket 18, as are rays R3 and R4 which strike the top surface 23a of the chamber 23 or the top either the side surface 23b of the chamber 23 along a region which does not result in reflection of light to the top surface of the wafer W, or strike the bottom surface 23c of the chamber 23. Thus rays R5 and R6 which pass the first and second shields 17, 19, are either reflected to the CCD camera 13, or are blocked therefrom by the backside of the wafer W. Although not shown, along the entire circumference of the wafer W, rays a such as Ray R5 are reflected past the edge of the wafer W, to CCD camera 13, providing an easily detectable backlit image of the wafer W.

The controller C receives the detection signal from the CCD camera 13 and analyzes the signal to determine the center and/or alignment of the wafer W, as is known in the art. For example, with reference to FIG. 1B(1), a triangulation method may be employed based on any two points ($P_1$, $P_2$) along a wafer W's edge. A tangent line $T_1$, $T_2$ is found for each point $P_1$, $P_2$, respectively, and the intersection I of a line perpendicular to each tangent line $T_1$, $T_2$ (e.g., perpendicular lines $PL_1$, $PL_2$, respectively) identifies the center of the wafer W. The wafer W's flat or notch (represented generally by reference character N) can be determined by examining the image of the wafer W along its outer edge as shown in FIGS. 1B(1) and 1B(2). Based on this determination, the controller C controls the operation of the rotatable platform 27 and/or the wafer handler 29, such that the wafer W is oriented and/or centered prior to being placed within a subsequent processing chamber (not shown). For instance, the controller C may cause the rotatable platform 27 to rotate the wafer W to a desired alignment, and may cause the wafer handler 29 to adjust the lateral position from which the wafer handler 29 approaches the wafer W, so as to thereby center the wafer W on the wafer handler 29's end effector. Alternatively the wafer handler 29 may adjust its angle of approach so as to affect proper alignment of the wafer W, and or other conventional mechanisms for aligning and/or centering the wafer W may be employed such as retractable wafer lift pins which extend from the rotatable platform 27 and which lift and shift the wafer in order to center the wafer. A preferred operation sequence of the wafer positioning device 11a wherein the wafer handler 29 adjusts its angle of approach to the wafer W so as to affect proper alignment is as follows:

1. The wafer handler 29 transfers the wafer W into the chamber 23. Simultaneously therewith information is provided to the controller C (e.g., via a fabrication tool system controller not shown) regarding the wafer size (e.g., 5, 6 or 8 inch), wafer type (e.g., flat or notched), and the step offset to which the wafer positioning device 11a should orient the flat or notch. This information also may be pre-programmed within the controller C;
2. The controller C sends a command to the CCD camera 13 to take a "picture" of the wafer W and the controller C determines the current position of the wafer W's flat or notch based on the picture data (as previously described);
3. The controller C further analyzes the picture data and determines how many steps, and in which direction (clockwise or counter clockwise) the rotation mechanism (not shown) coupled to the rotatable platform 27 must rotate the rotatable platform 27 to place the flat or notch in the desired offset position;
4. The controller C sends a command to the rotation mechanism to start wafer rotation (e.g., via stepper drivers on an orienter control board that drives a stepper motor coupled to the rotatable platform 27);
5. The controller C sends a second command to the CCD camera 13 to take a second "picture" of the wafer;
6. The controller C analyzes the picture data and determines the center of the wafer W as previously described (e.g., via a triangulation method);
7. Once the wafer center is known, the controller C uses the center information to correct any error in the offset of the notch or flat due to mis-centering of the wafer W on the rotatable platform 27;
8. The controller C sends a command to the rotation mechanism to start wafer rotation and the wafer W rotates no more than 180 degrees (as rotation is always directed toward the shortest angle);
9. The controller C sends wafer center location information to the wafer handler 29 (e.g., which is controlled by a system controller not shown) to cause the wafer handler 29 to position the wafer W on the center of the handler's blade. This information consists of three variables: $\Delta R$, $\Delta\theta$, and R-Offset as shown in FIG. 1C(2) where:

$\Delta R$ is the distance between the wafer W's center (WC) and rotatable platform 27's center (RPC) measured perpendicular to the center point of the chamber 23's slit valve (not shown);

Δθ is the angle which the wafer handler 29 should rotate to pick up the wafer W in the center of the handler's blade; and R-Offset is the straight line distance between the wafer center (WC) and the rotatable platform 27 center (RPC); and 10. The ΔR and Δθ are converted (e.g., via a system controller not shown) into motor step counts that are used to position the wafer handler 29 below the wafer W, the wafer handler is appropriately positioned and the wafer is picked-up and transferred from the chamber 23. Note that the R-Offset is used during wafer centering (step 7 above).

Preferably the bottom surface 23c of the chamber 23 is roughened (e.g., via bead blasting, application of a thermal spray coating, or via a chemical roughening process, etc.) such that light which impacts the bottom surface 23c of the chamber 23 is scattered as represented generally by ray R6. Scattering the reflected light insures that some light will impact the bottom surface of the wafer W, and some light will pass by the edge of the wafer W, thus sharpening the outline of the wafer W detected by the CCD camera, and facilitating reliable positioning.

Figure 2:
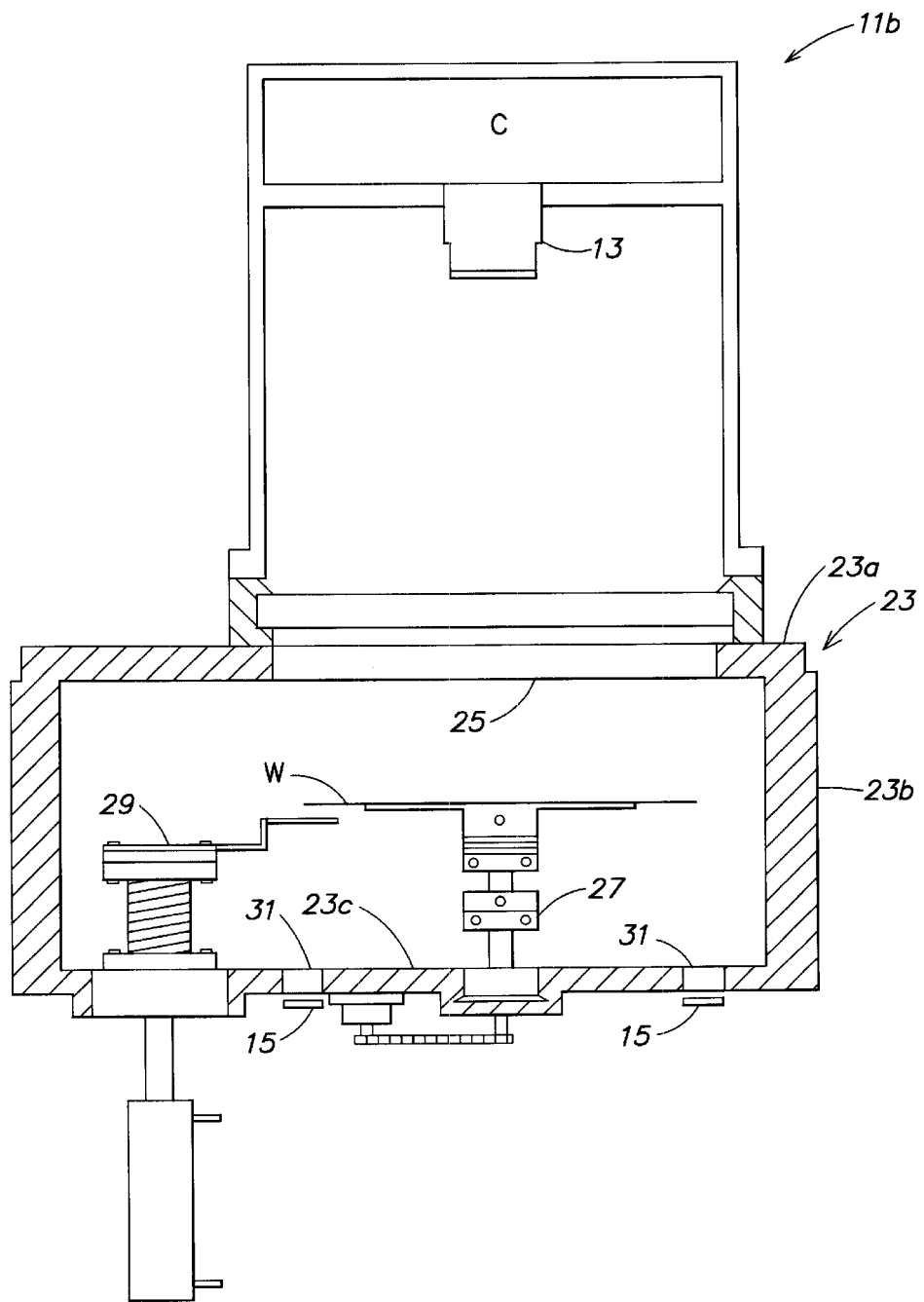
FIG. 2 is a schematic side elevational view of a second aspect of the inventive wafer positioning device.

FIG. 2 is a schematic side elevational view of a second aspect of the inventive wafer positioning device 11b. The wafer positioning device 1ib is identical to the wafer positioning device 11a shown and described with reference to FIG. 1A, except for the location of the ring of LEDs 15. Accordingly only the differences between the first aspect of the inventive wafer positioning device, and the second aspect of the inventive wafer positioning device are described with reference to FIG. 2. Specifically, a backlighting source such as a ring shaped fluorescent lamp or a ring of LEDs 15 is positioned along the bottom surface 23c of the vacuum chamber 23 so as to direct light through a quartz window 31, located in the bottom surface 23c of the vacuum chamber 23. The quartz window 31 and the ring of LEDs 15 are positioned to supply light to part or all of the backside of the wafer W, as well as to supply light beyond the edge of the wafer W, such that the CCD camera 13 can detect the edge of the wafer W. Thus, the inventive wafer positioning device 11b may operate without the aid of the first shield 17 and/or the second shield 19 of FIG. 1A.

Figure 3:
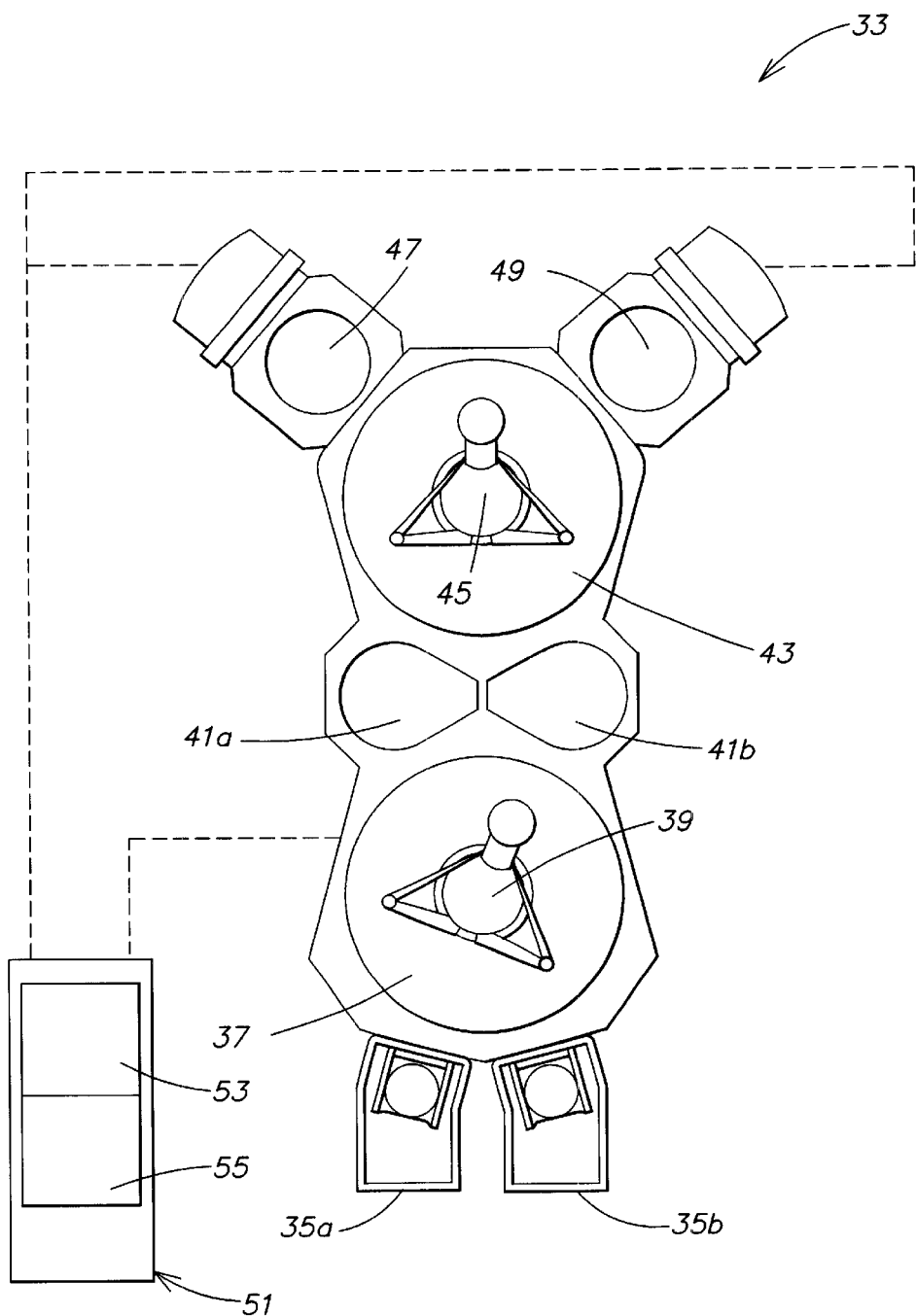
FIG. 3 is a top plan view of an automated tool for fabricating semiconductor devices, which employs the inventive wafer positioning device of FIGS. 1 or 2.

FIG. 3 is a top plan view of an automated tool 33 for fabricating a portion of a semiconductor device, such as the deposition of an interconnect layer The tool 33 comprises a pair of load locks 35a, 35b, and a first wafer handler chamber 37 containing a first wafer handler 39. The first wafer handler chamber 37 is operatively coupled to the pair of load locks 35a, 35b and to a pair of pass-through chambers 41a, 41b. The pair of pass-through chambers 41a, 41b are further coupled to a second wafer handler chamber 43, containing a second wafer handler 45. The second wafer handler chamber 43 and the second wafer handler 45 are coupled to a plurality of processing chambers 47, 49, each of which may require wafer alignment prior to processing therein. Most importantly, the pass-through chambers 41a, and/or 41b contain the inventive wafer positioning device of FIGS. 1 or 2. The entire tool 33 is controlled by a controller 51 (which comprises a microprocessor 53 and a memory 55) having a program therein which controls semiconductor wafer transfer among the load locks 35a, 35b, the pass-through chambers 41a, 41b, and the processing chambers 47, 49.

The controller program may include control of the inventive wafer positioning device, or may interface with the controller C of the inventive wafer positioning device, to achieve wafer centering or orientation, as previously described. Inclusion of the inventive wafer positioning device anywhere within the tool 33 will improve the tool's overall productivity and reliability. However, by employing the inventive wafer positioning device within the pass-through chambers 41a, 41b, a wafer can be centered and/or oriented in route between a first wafer handler chamber and a second wafer handler chamber, without requiring additional wafer transfer time, and without occupying a valuable wafer processing chamber location. Thus, by employing the inventive wafer positioning device, the throughput of the automated semiconductor processing tool increases significantly.

The foregoing description discloses only the preferred embodiments of the invention, modifications of the above disclosed apparatus and method which fall within the scope of the invention will be readily apparent to those of ordinary skill in the art. For instance, although the inventive wafer positioning device is particularly well-suited for positioning wafers within vacuum chambers, the inventive wafer positioning device may be employed within the same environment as the wafer, in appropriate applications (e.g., chemical mechanical polishing, cleaning, electro-chemical plating). The wafer need not be horizontally oriented, and the CCD camera need not be aimed at the top surface of the wafer. Thus, it will be apparent to those of ordinary skill in the art, that the term "backlighting" is used only for convenience, and is not to be limited to any particular surface of the wafer. Accordingly, a vertically oriented wafer may be positioned via use of a CCD camera aimed at the back surface of the wafer, etc.

Similarly, when the CCD camera and backlighting source are positioned along the same side of the wafer, the backlighting source may reflect from surfaces other than the bottom surface of the chamber in which positioning occurs, depending on the orientation of the wafer being positioned. In fact, light from the backlighting source may reflect from any appropriately positioned surface which is beyond the wafer being positioned.

Finally, the shields shown and described herein are merely preferred. It will be understood that the two shields may be integrally formed, and that chamber surfaces, the quartz window or the backlighting source itself, may be designed so as to prevent direct or reflected light originated by the backlighting source, from impacting the surface of the wafer and reflecting to the CCD camera and thus would be considered shields.

Accordingly, while the present invention has been disclosed in connection with the preferred embodiments thereof, it should be understood that other embodiments may fall within the spirit and scope of the invention, as defined by the following claims.

The invention claimed is:

1. A positioning device, comprising:
   a charge coupled device camera adapted to detect a first region which is larger than a wafer to be detected by the charge coupled device camera so as to encompass the edge of the wafer to be detected;
   a backlighting source adapted to direct light to a second region which extends outwardly from at least the edge of the wafer to be detected by the charge coupled device camera;
   a shield operatively coupled to the backlighting source so that light emitted from the backlighting source is blocked from reaching a first surface of the wafer; and
   a controller operatively coupled to the charge coupled device camera adapted to determine the wafer's position based on the backlighting detected by the charge coupled device camera.

2. A fabrication tool, comprising:
  a first wafer handler chamber containing a first wafer handler adapted to transfer wafers;
  a second wafer handler chamber containing a second wafer handler adapted to transfer wafers;
  a pass-through chamber coupled between the first wafer handler chamber and the second wafer handler chamber, adapted to receive wafers traveling between the first wafer handler chamber and the second wafer handler chamber; and
  the positioning device of claim 1, operatively coupled to the pass-through chamber so as to detect the position of a wafer passing therethrough.

3. The positioning device of claim 1 wherein the charge coupled device camera and the backlighting source are located beyond the first surface of the wafer, and wherein the apparatus further comprises:
  a surface located beyond a second surface of the wafer.

4. The positioning device of claim 3 further comprising:
  a second shield positioned to block reflected light emitted from the backlighting source from reaching the first surface of the wafer.

5. The positioning device of claim 4 wherein the surface located beyond the second surface of the wafer is rough so that light scatters as it reflects therefrom.

6. The positioning device of claim 4 wherein the controller is adapted to determine the wafer's alignment based on the light detected by the charge coupled device camera.

7. The positioning device of claim 4 wherein the controller is adapted to determine the wafer's center based on the light detected by the charge coupled device camera.

8. The positioning device of claim 4 wherein the controller is adapted to determine the wafer's alignment and center based on the light detected by the charge coupled device camera.

9. A fabrication tool, comprising:
  a first wafer handler chamber containing a first wafer handler adapted to transfer wafers;
  a second wafer handler chamber containing a second wafer handler adapted to transfer wafers;
  a pass-through chamber coupled between the first wafer handler chamber and the second wafer handler chamber, adapted to receive wafers traveling between the first wafer handler chamber and the second wafer handler chamber; and
  the positioning device of claim 4, operatively coupled to the pass-through chamber so as to detect the position of a wafer passing therethrough.

10. The positioning device of claim 3 wherein the surface located beyond the second surface of the wafer is rough so that light scatters as it reflects therefrom.

11. The positioning device of claim 3 wherein the controller is adapted to determine the wafer's alignment based on the light detected by the charge coupled device camera.

12. The positioning device of claim 3 wherein the controller is adapted to determine the wafer's center based on the light detected by the charge coupled device camera.

13. The positioning device of claim 3 wherein the controller is adapted to determine the wafer's alignment and center based on the light detected by the charge coupled device camera.

14. A fabrication tool, comprising:
  a first wafer handler chamber containing a first wafer handler adapted to transfer wafers;
  a second wafer handler chamber containing a second wafer handler adapted to transfer wafers;
  a pass-through chamber coupled between the first wafer handler chamber and the second wafer handler chamber, adapted to receive wafers traveling between the first wafer handler chamber and the second wafer handler chamber; and
  the positioning device of claim 3, operatively coupled to the pass-through chamber so as to detect the position of a wafer passing therethrough.

15. A positioning device, comprising:
  a charge coupled device camera adapted to detect a first region which is larger than a wafer to be detected by the charge coupled device camera so as to encompass the edge of the wafer to be detected;
  a backlighting source adapted to direct light to a second region which extends outwardly from at least the edge of the wafer to be detected by the charge coupled device camera;
  wherein the charge coupled device camera and the backlighting source are located beyond a first surface of the wafer;
  a controller operatively coupled to the charge coupled device camera adapted to determine the wafer' position based on the backlighting detected by the charge coupled device camera; and
  a rough surface located beyond a second surface of the wafer so that light scatters as it reflects therefrom.

16. A fabrication tool, comprising:
  a first wafer handler chamber containing a first wafer handler adapted to transfer wafers;
  a second wafer handler chamber containing a second wafer handler adapted to transfer wafers;
  a pass-through chamber coupled between the first wafer handler chamber and the second wafer handler chamber, adapted to receive wafers traveling between the first wafer handler chamber and the second wafer handler chamber; and
  a positioning device, operatively coupled to the pass-through chamber so as to detect the position of a wafer passing therethrough, the positioning device comprising:
    a charge coupled device camera adapted to detect a first region which is larger than a wafer to be detected by the charge coupled device camera so as to encompass the edge of the wafer to be detected;
    a backlighting source adapted to direct light to a second region which extends outwardly from at least the edge of the wafer to be detected by the charge coupled device camera;
    wherein the charge coupled device camera and the backlighting source are located beyond a first surface of the wafer;
    a controller operatively coupled to the charge coupled device camera adapted to determine the wafer's position based on the backlighting detected by the charge coupled device camera; and
    a surface located beyond a second surface of the wafer.

* * * * *